(12) United States Patent
Tsai

(10) Patent No.: US 8,514,570 B2
(45) Date of Patent: Aug. 20, 2013

(54) POWER SUPPLY SYSTEM

(75) Inventor: Yu-Chi Tsai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 209 days.

(21) Appl. No.: 13/234,111

(22) Filed: Sep. 15, 2011

(65) Prior Publication Data

US 2013/0044428 A1  Feb. 21, 2013

(30) Foreign Application Priority Data

Aug. 17, 2011 (TW) ................................ 100129409

(51) Int. Cl.
*H05K 7/20* (2006.01)
(52) U.S. Cl.
USPC ............................ 361/690; 361/692; 361/715
(58) Field of Classification Search
None
See application file for complete search history.

(56) References Cited

U.S. PATENT DOCUMENTS

| | | | | |
|---|---|---|---|---|
| 4,899,254 A * | 2/1990 | Ferchau et al. | ............... | 361/695 |
| 5,398,161 A * | 3/1995 | Roy | ............................... | 361/727 |
| 6,411,514 B1 * | 6/2002 | Hussaini | ....................... | 361/704 |
| 2005/0122682 A1 * | 6/2005 | Streit et al. | ..................... | 361/695 |
| 2007/0293137 A1 * | 12/2007 | Crippen et al. | ............... | 454/184 |
| 2008/0160899 A1 * | 7/2008 | Henry et al. | .................. | 454/184 |
| 2008/0266792 A1 * | 10/2008 | Li et al. | ........................ | 361/695 |
| 2012/0250279 A1 * | 10/2012 | Harashima et al. | ........... | 361/760 |

\* cited by examiner

*Primary Examiner* — Gregory Thompson
(74) *Attorney, Agent, or Firm* — Altis Law Group, Inc.

(57) ABSTRACT

A power supply system includes a distribution board, two power supplies, an interface board, and a cable. The interface board comprises two parallel connectors arranged at a center portion of a first side of the interface board, a pair of vents respectively defined beside the two connectors, and a first adapter connector formed at an end portion of the first side. The distribution board is coupled to a second side of the interface board and comprising a second adapter connector arranged thereon. The power supplies are respectively connected to the two connectors and each defines an air vent in alignment with the vents of the interface board. The cable is connected between the first adapter connector and the second adapter connector.

5 Claims, 2 Drawing Sheets

POWER SUPPLY SYSTEM

BACKGROUND

1. Technical Field

The present disclosure relates to a power supply system.

2. Description of Related Art

Many power supply systems used in electronic devices include an interface board, and two parallel connectors arranged centrally at one side of the board and connected to two power supplies, and a second connector arranged centrally at a another side of the board and connected to a distribution board. Air vents are defined in the interface board to allow air to flow through the power supplies. However, the second connector is located in the path of the airflow, which may prevent efficient cooling of the power supplies.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
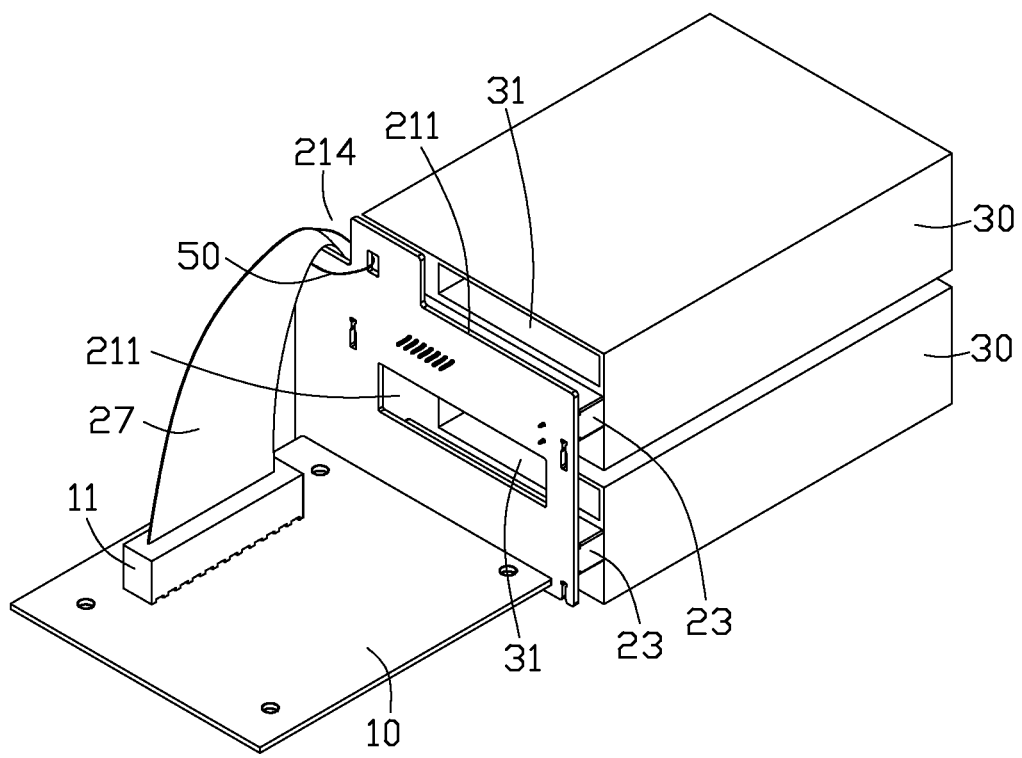
FIG. 1 is an isometric view of an exemplary embodiment of a power supply system.
Figure 2:
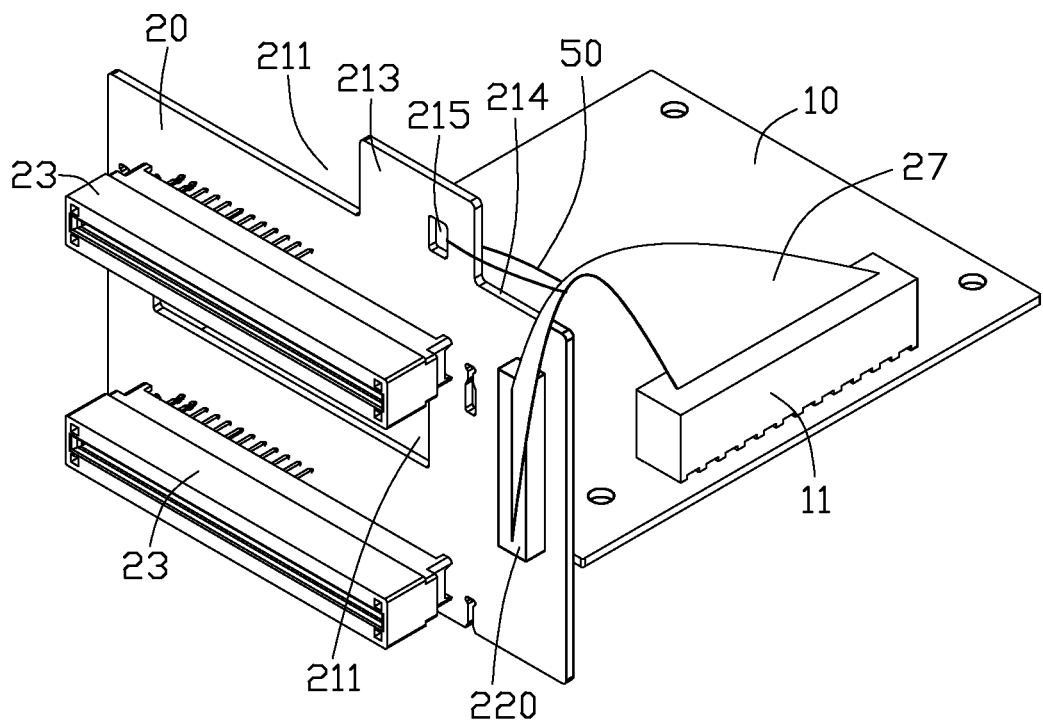
FIG. 2 is similar to FIG. 1, but viewed from another aspect, with two power supplies omitted.

Referring to FIGS. 1 and 2, an exemplary embodiment of a power supply system includes two power supplies 30, a distribution board 10, a interface board 20, a cable 27, and a cable clip 50.

The interface board 20 is rectangular. A first side of the interface board 20 includes two parallel connectors 23 formed at a center portion thereof and extending along a length of the interface board 20, one above the other. Two rectangular vents 211 are respectively defined beside the two connectors 23 and extend along the length of the interface board 20. An upper vent 211 (cutout) is defined at an up-right corner of the interface board 20. A lower vent 211 is defined between the two connectors 23. A cutout 214 is defined at an up-left corner of the interface board 20. An extension portion 213 is formed between the upper vent 211 and the cutout 214. A through hole 215 is defined in the extension portion 213. A first adapter connector 220 is vertically formed at an end portion of the first side of the interface board 20 and extends along a width of the interface board 20.

The distribution board 10 is coupled to a lower portion of a second side of the interface board 20 and includes a second adapter connector 11 formed thereon.

Each of the power supplies 30 defines an air vent 31 in an end wall thereof. The two power supplies 30 respectively connect to the two connectors 23, with the two air vents 31 respectively aligned with the two vents 211. The cable 27 extends through the cutout 214 and two ends of the cable 27 respectively connect with the first adapter connector 220 and the second adapter connector 11. The clip 50 extends through the through hole 215 to retain the cable 27 in the cutout 214.

The first adapter connector 220 is arranged at the end portion of the interface board 20. As a result, the two vents 211 can be respectively defined beside the two power connectors 23 to align with the air vents 31. Thus, air flow to the power supplies 30 is not impeded.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A power supply system, comprising:
an interface board comprising two parallel connectors arranged at a first side of the interface board, two vents respectively defined beside the two power connectors, and a first adapter connector formed at an end portion of the first side;
a distribution board coupled to a second side of the interface board and comprising a second adapter connector arranged thereon;
two power supplies respectively connected to the two connectors and each defining an air vent in an end wall of the power supplies aligned with a corresponding vent of the interface board; and
a cable with its two ends respectively connecting to the first adapter connector and the second adapter connector.

2. The power supply system of claim 1, wherein a cutout is defined in the interface board for the cable extending therethrough.

3. The power supply system of claim 2, wherein a through hole is defined in the interface board for a cable clip extending therethrough to retain the cable.

4. The power supply system of claim 3, wherein the interface board is rectangular, the power supplies and the vents extend along a length of the interface board, the first adapter connector extends along the width of the interface board.

5. The power supply system of claim 4, wherein one of the two vents of the interface board is located at a first corner of the interface board, the cutout is defined at a second corner of the interface board beside the first corner, an extension portion is formed between the one vent and the cutout, the through hole is defined in the extension portion.

* * * * *